(12) United States Patent
Hellwig et al.

(10) Patent No.: US 8,378,675 B2
(45) Date of Patent: Feb. 19, 2013

(54) CURRENT SENSOR, CURRENT MEASURING MODULE AND METHOD FOR MEASURING CURRENT

(75) Inventors: Wolfgang Hellwig, Gomaringen (DE); Valentin Tils, Nehren (DE); Martin Holzmann, Gomaringen (DE); Kerstin Feddern, Reutlingen (DE); Friedemann Eberhardt, Reutlingen (DE); Michael Munz, Reutlingen (DE); Stefan Ruebenacke, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 264 days.

(21) Appl. No.: 12/806,319

(22) Filed: Aug. 9, 2010

(65) Prior Publication Data

US 2011/0057650 A1    Mar. 10, 2011

(30) Foreign Application Priority Data

Sep. 4, 2009    (DE) .................. 10 2009 029 209

(51) Int. Cl.
*G01R 33/02* (2006.01)
(52) U.S. Cl. ....................................................... 324/252
(58) Field of Classification Search .................. 324/252
See application file for complete search history.

(56) References Cited

U.S. PATENT DOCUMENTS 7,119,533 B2 * 10/2006 Tamura et al. ................ 324/202
7,259,546 B1 *  8/2007 Hastings et al. .......... 324/117 H

* cited by examiner

*Primary Examiner* — Reena Aurora
(74) *Attorney, Agent, or Firm* — Kenyon & Kenyon LLP

(57) ABSTRACT

A current sensor for measuring a current in a conductor includes two magnetic field sensors located adjacent to the conductor. The magnetic field sensors are at least two-dimensional magnetic field sensors having two measuring directions, thereby facilitating compensation for an inhomogeneous interference field.

13 Claims, 4 Drawing Sheets

CURRENT SENSOR, CURRENT MEASURING MODULE AND METHOD FOR MEASURING CURRENT

BACKGROUND OF THE INVENTION

1. Field of the Invention

The present invention relates to a current sensor having a conductor and two magnetic field sensors adjacent to the conductor.

2. Description of Related Art

Various types of current sensors having Hall elements as magnetic field sensors are known. One type of current sensor having a flux concentrator for intensifying the magnetic field at the location of the magnetic field sensor typically utilizes a single magnetic field sensor which is situated in an air gap of the flux concentrator. The disadvantage of this type of sensor is a large physical size and a high component weight. The physical size prevents, for example, the sensors from being integrated into mold-base power modules. Additional disadvantages are hysteresis effects that occur when the field strength acting on the flux concentrator exceeds a maximum value, for example, due to currents in connection with high interference fields lying outside of the sensor's measuring range. Another type of current sensor has one or a plurality of one-dimensional magnetic field sensors directly adjacent to the conductor. This sensor type is suitable for integration into mold-base modules; however, it is unable to compensate for any interference fields. One version of this type having two magnetic field sensors situated symmetrical to the conductor in a differential configuration is able to eliminate a homogeneous interference field. However, non-homogeneous magnetic fields generate an interference which significantly reduces the achievable accuracy, eliminating this system for applications having exacting measuring accuracy requirements, for example, 2% combined error. Such a sensor is described, for example, in US Patent Application Publication 2006/284613.

BRIEF SUMMARY OF THE INVENTION

A current sensor according to the present invention having one conductor and two at least two-dimensional magnetic field sensors adjacent to the conductor has the advantage that the sensor is able to eliminate inhomogeneous interference fields and nonetheless is usable in mold-base modules. The magnetic field sensors may be designed as one element or be made up of a plurality of one-dimensional elements.

The present invention is based on the consideration that it may be assumed that an inhomogeneous interference field has the same field strength ratio in various spatial directions at two locations physically close to one another. Another consideration is that due to the current flowing through the conductor, field lines of the useful field run concentrically around it, and for that reason the direction of the useful field in space at the location of the sensors and the ratio of the amounts of the field strengths of the useful field are known based on the distance from the conductor. In addition, the magnetic field sensors need not be symmetrical to the conductor on both sides, nor must they even be located on different sides of the conductor. However, the present invention is explained based on the easily comprehensible special case in which the magnetic field sensors are situated on both sides symmetrical to the conductor. The useful field strengths present at the locations of the magnetic field sensors are then of an equal amount and have opposite signs in the same spatial direction. In the spatial direction of the useful field, the measuring field measured by the sensors is made up of the sum, referred to here as test field, of the useful field and an interference field component in the useful field direction. The direction of the test field is defined based on this geometry. In the plane perpendicular to the useful field direction, the measuring field corresponds to the interference field, since the useful field is equal to zero here. Therefore, according to the present invention, a vector decomposition of the measuring field measured by the sensors may be used for determining the inhomogeneity of the interference field in the spatial direction perpendicular to the useful field. This inhomogeneity is also assumed for the spatial direction of the useful field and is transferred to the test field. With consideration of the properties of the useful field—identical amount, opposite direction at the location of the two sensors—the useful field and the interference field component in the useful field direction are calculated from the inhomogeneity. Finally, the current intensity in the conductor is calculated from the useful field.

These considerations apply in principle in the three-dimensional space independent of the orientation of the magnetic field sensors with respect to the conductor, since a decomposition of the measured three-dimensional vectors makes it possible to rotate the reference system into a reference system oriented to the test field. The reference system is thus rotated into a system in which a first detection direction lies in the direction of field lines of a magnetic field based on a current flowing in the conductor and a second detection direction lies in a plane perpendicular to it. The preferred configurations are those in which the sensors are situated in such a way that the useful field strengths at the locations of both sensors are of the same amount and lie in the same direction. On the one hand, this would be the configuration of the sensors lying symmetrically on both sides of the conductor having diametrically opposed useful field directions in the same spatial direction as described in these examples. On the other hand, a preferred configuration is one in which the sensors lie parallel to the conductor, i.e. virtually on the same side of a conductor and at the same distance from the conductor, so that the useful field strengths at the locations of both sensors are of the same amount and are oriented in the same spatial direction. Other configurations may be considered with higher computational complexity. Moreover, the use of additional sensors is possible.

In practical application, the orientation of the magnetic field sensors is preferably in test field direction, so that a measuring direction of the sensors having the first detection direction coincides with the direction of field lines of the magnetic field based on the current flowing in the conductor.

In a simple case, the present invention may be implemented using two-dimensional magnetic field sensors, i.e. magnetic field sensors having two independent measuring directions, in that the second detection direction lies largely anywhere in the plane perpendicular to the first detection direction if it is ensured that one component of the interference field is present in the second detection direction.

Two three-dimensional magnetic field sensors are present in an example embodiment of the current sensor according to the present invention, i.e., magnetic field sensors having three independent measuring directions, situated adjacent to the conductor, a third detection direction lying perpendicular to the first and second detection direction. This makes knowledge concerning the interference field no longer necessary, since a component is detected in the plane perpendicular to the first detection direction in any case. The three-dimensional magnetic field sensors allow a vector decomposition of the interference field and accordingly the calculation of the portion of the interference field acting in the useful direction.

This portion may be compensated computationally. As a result, the magnetic field generated by the conductor through which current flows and thus the current intensity flowing through the conductor may be determined with high accuracy. Furthermore, it is possible to identify the primary originator from potential interference sources with the aid of three-dimensional field detection.

The magnetic field sensors are preferably Hall elements, AMR (anisotropic magnetoresistance), GMR (giant magneto-resistance), TMR (tunneling magnetoresistance), or fluxgate sensors.

In an example embodiment of the present invention, the interference field is eliminated by an integrated evaluation unit which uses measured values of the magnetic field sensors to determine a test field in the direction of the field lines of a magnetic field based on a current flowing in the conductor and an interference field in the direction perpendicular to field lines of the magnetic field based on the current flowing in the conductor and determines the current in the conductor from the test field and interference field.

A current measuring module according to the present invention having a current sensor according to the present invention includes a system of the magnetic field sensors and the evaluation unit in a housing surrounding the conductor.

A method for measuring current according to the present invention having a current sensor for measuring a current in a conductor, using at least two two-dimensional magnetic field sensors adjacent to the conductor, includes the method steps:
a. detecting a measuring field using measured values of the magnetic field sensors;
b. determining the field strengths of a test field in the direction of the field lines of a magnetic field based on a current flowing in the conductor;
c. determining the field strengths of a component of an interference field in a direction perpendicular to field lines of the magnetic field based on the current flowing in the conductor;
d. detecting the inhomogeneity of an interference field from the determined field strengths of the component of the interference field;
e. determining the useful field based on the current flowing in the conductor from the field strengths of the test field and the inhomogeneity of the interference field;
f. determining the current in the conductor from the useful field.

In one example method of the present invention, the magnetic field sensors are oriented in such a way that one measuring direction coincides with the direction of the field lines of a magnetic field based on a current flowing in the conductor.

In one example method of the present invention for measuring current using a current sensor having two three-dimensional magnetic field sensors, the field strengths of the interference field are determined in one plane perpendicular to field lines of the magnetic field based on the current flowing in the conductor. The interference field is detected in the direction of a maximum field strength of the interference field within the plane.

DETAILED DESCRIPTION OF THE INVENTION

Figure 1:
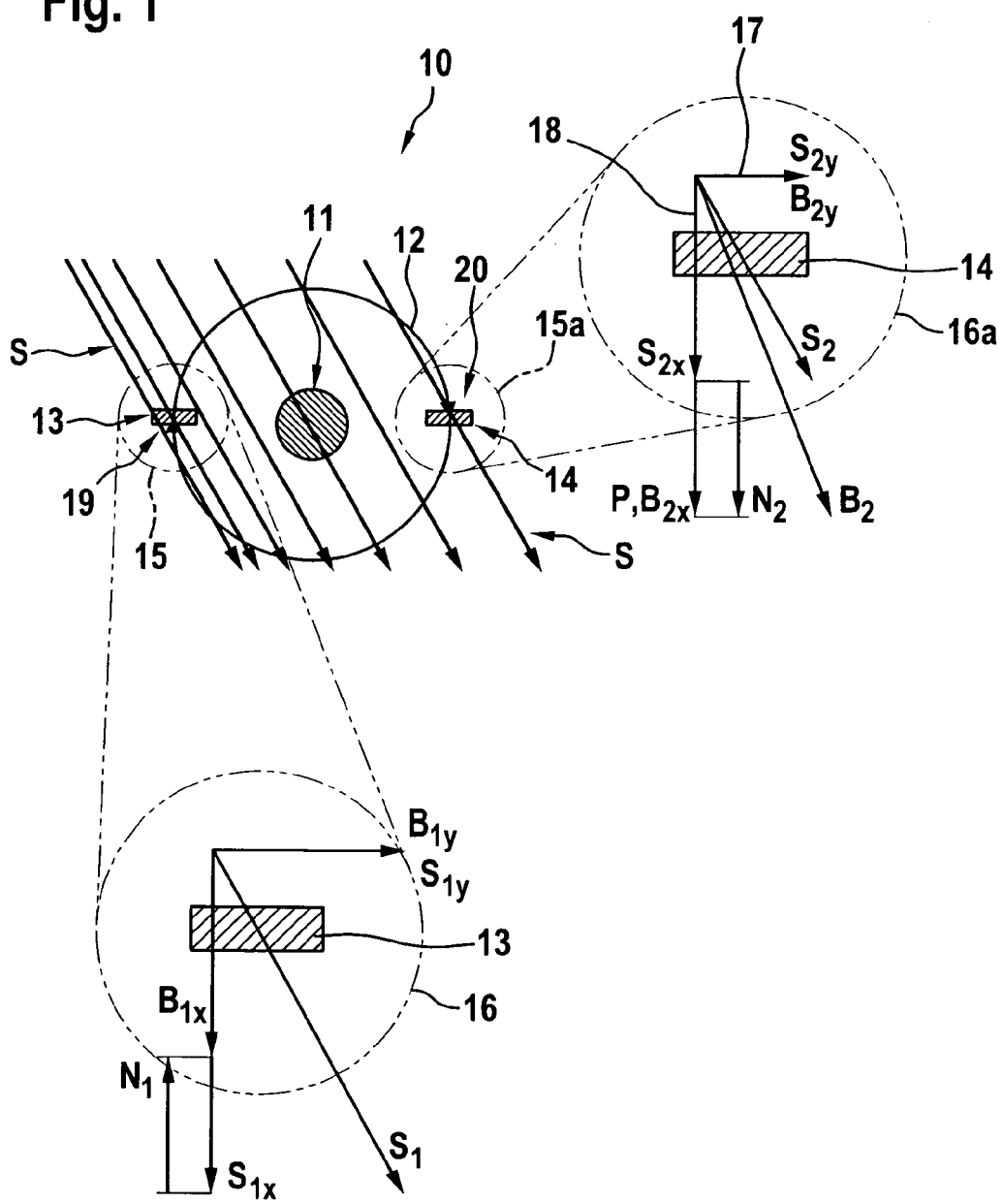
FIG. 1 shows a schematic cross-sectional representation of a current sensor according to the present invention in an inhomogeneous magnetic field.

FIG. 1 shows a two-dimensional cross-section of a current sensor 10 according to the present invention in an inhomogeneous magnetic interference field S. The direction of interference field S is represented by arrows; the strength of the field is shown by the density of the arrows; in this case, the strength of the field increases from right to left in the image. According to the present invention, this inhomogeneity of the interference field is compensated in the current measurement. Conductor 11, through which current flows, shown in cross section, generates a magnetic useful field N, represented by an annular field line 12. In addition to a conductor 11 through which current flows, a first magnetic field sensor 13 and a second magnetic field sensor 14 are situated symmetrical to conductor 11. In the drawing, annular field line 12 penetrates both magnetic field sensors 13, 14, primarily perpendicularly. Magnetic field sensors 13, 14 are oriented in such a way that this direction of penetration is simultaneously a measuring direction of the magnetic field sensors. Details 15, 15a around magnetic field sensors 13, 14 are shown enlarged in circles 16, 16a to show a vector decomposition of the overlapping magnetic fields at the location of first magnetic field sensor 13 indexed as 1 and at the location of second magnetic field sensor 14 indexed as 2. B1 and B2 are the measured measuring field vectors having components B1x and B1y as well as B2x and B2y in two measuring directions of sensors 13, 14. Arrow 17, which represents component B2x, points in an x direction, and arrow 18, which represents component B2y, points in a y direction of a coordinate system selected for the decomposition. According to the orientation of magnetic field sensors 13, 14, this coordinate system has already been selected in such a way that field line 12 of useful field N penetrates magnetic field sensor 14 in the +x direction and magnetic field sensor 13 in the –x direction. This orientation of the magnetic field sensors causes the measuring direction of component B1x, B2x to coincide with the first detection direction described above. And the y direction runs through the connection line of magnetic field sensors 13, 14 in a second measuring direction of magnetic field sensors 13, 14. In the y direction, the useful field disappears at both magnetic field sensors 13, 14, and measuring field components B1y and B2y coincide with interference field component S1y and S2y. In the x direction, measuring field component B2x at second magnetic field sensor 14 is a vector addition from interference field component S2x and useful field N2 to be determined. The z direction runs parallel to the conductor; however, it is not shown. With regard to the magnetic fields, the z direction corresponds to the y direction, since an interference field component is also present here at the location of the sensors but no useful field component is present. The shown x and y directions represent a preferred orientation of a current sensor both in the embodiment having two-dimensional magnetic field sensors and in the embodiment having three-dimensional magnetic field sensors.

The compensation of the interference field is elucidated using a simplified two-dimensional case which is shown as an example embodiment in FIG. 1. Compared to the general case, the simplification is that magnetic field sensors 13, 14 are already oriented in such a way that the useful field at the location of the sensors is only different from zero in the x direction and therefore the direction of test field P coincides with the x direction, and no coordinate transformation is needed. Field strengths B1x and B2x measured by magnetic field sensors 13, 14 in the x direction contain the overlapping, denoted here as test field P1, P2, from useful field N1, N2 and the x component of interference field S1x, S2x. The opposite signs of the useful field strengths of identical amounts at the locations of the two sensors must be taken into account based on the direction of the circular useful field shown by arrows 19, 20. Field strengths B1y, B2y measured in the y direction by magnetic field sensors 13, 14 include only the y components of the interference field. At a slight distance of magnetic field sensors 13, 14 from one another, it may now be assumed that the inhomogeneous interference field in the x direction has the same field strength ratio, here referred to as the inhomogeneity ratio, as that of the measured field strengths in the y direction S1x/S2x=S1y/S2y. Having knowledge concerning the amount and sign of useful field N, namely $|N|=|N1|=|N2|$ and $N1=-N2$, it is accordingly possible to determine the field strength of the interference field in the x direction S1x and S2x at each of magnetic field sensors 13, 14 and accordingly in turn the field strength of useful field N1 and N2 and finally the current intensity flowing in the conductor. In the two-dimensional case, the y direction coincides with the above-described second detection direction due to the orientation of the magnetic field sensors.

For the expansion to include the case having three-dimensional magnetic field sensors, a third measuring direction is added in the z direction. The position of the second detection direction may be selected within the y-z plane with a certain degree of latitude if the interference field strength is great enough for determining the inhomogeneity ratio. However, the best selection of the detection direction is the direction in the y-z plane determined by vector addition in which the largest measured interference field vector of the two magnetic field sensors 13, 14 is present. The highest accuracy is achieved in this manner.

Figure 2:
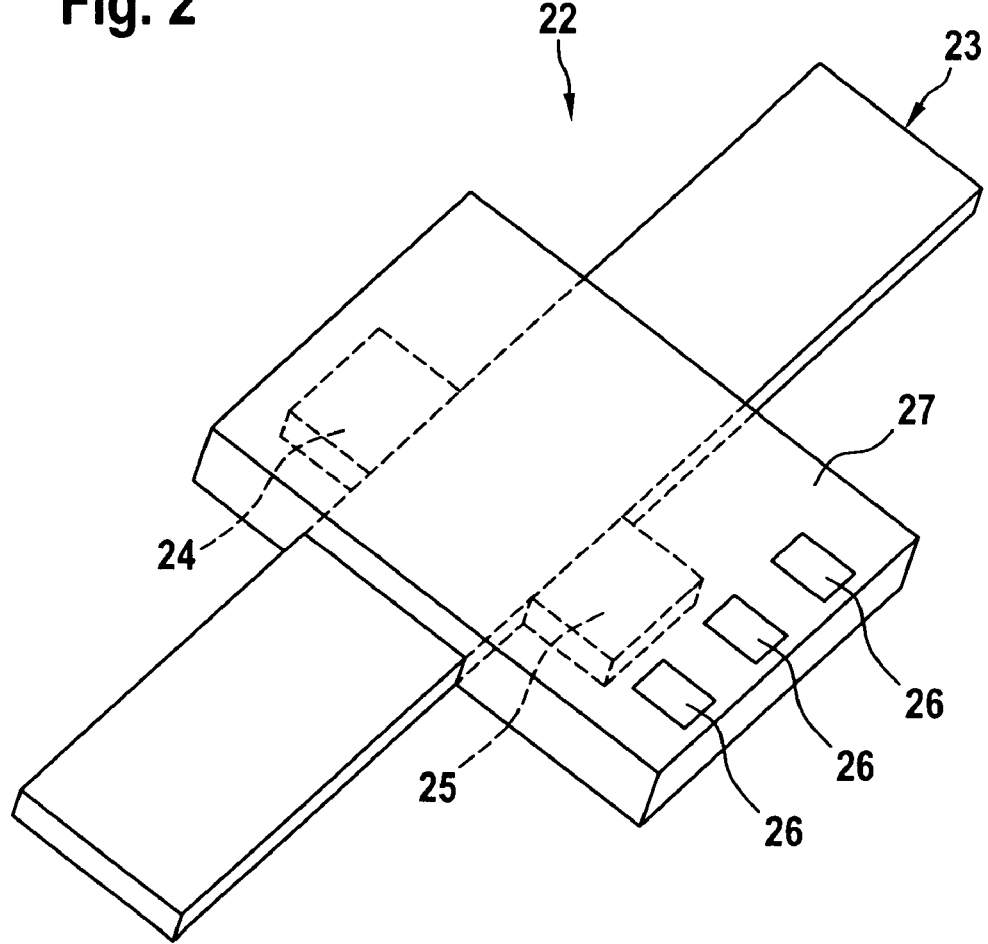
FIG. 2 shows a schematic representation of a current sensor module according to the present invention as an integrated system.

A current sensor module 22 according to the present invention is shown as an integrated system in FIG. 2. Module 22 is fastened to a conductor 23. Magnetic field sensors, Hall sensors 24, 25 in this case, are connected to contacts 26 and situated on a carrier 27, a printed board in this case (connector terminals not shown). Module 22 is configured for fastening to a conductor 23 and is shown in a fastened state. Contacts 26 are accessible from the outside. This integrated system is suitable for configurations having additional conductor segments.

Figure 3:
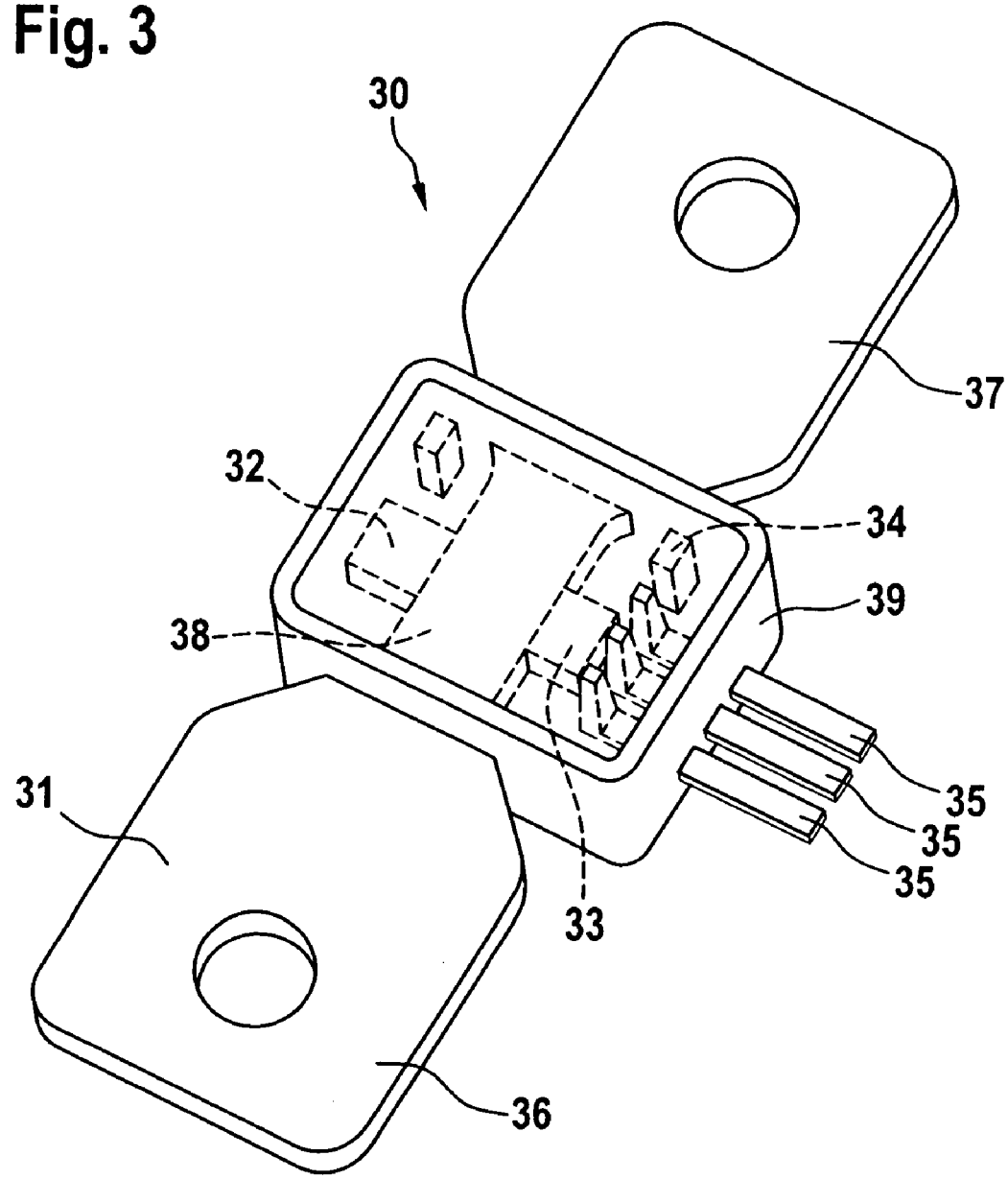
FIG. 3 shows a schematic representation of a current sensor module according to the present invention as an independent module.

FIG. 3 shows a current sensor module 30 according to the present invention as an independent module. Magnetic field sensors, Hall sensors 32, 33 in this case, are situated adjacent to a conductor 31. Hall sensors 32, 33 are connected to an evaluation unit 34 which is in turn connected to contacts 35. The conductor is made up of diametrically opposed terminals 36, 37 and a tapered section 38 between them. Hall sensors 32, 33, tapered section 38 of the printed conductor track, evaluation unit 34, and contacts 35 are embedded in a plastic housing 39, contacts 35 being led out. Using measured values of the magnetic field sensors, integrated evaluation unit 34 determines a test field in the direction of the field lines of a magnetic field based on a current flowing in the conductor and an interference field in the direction perpendicular to it and determines the current in the conductor from the test field and interference field.

Figure 4:
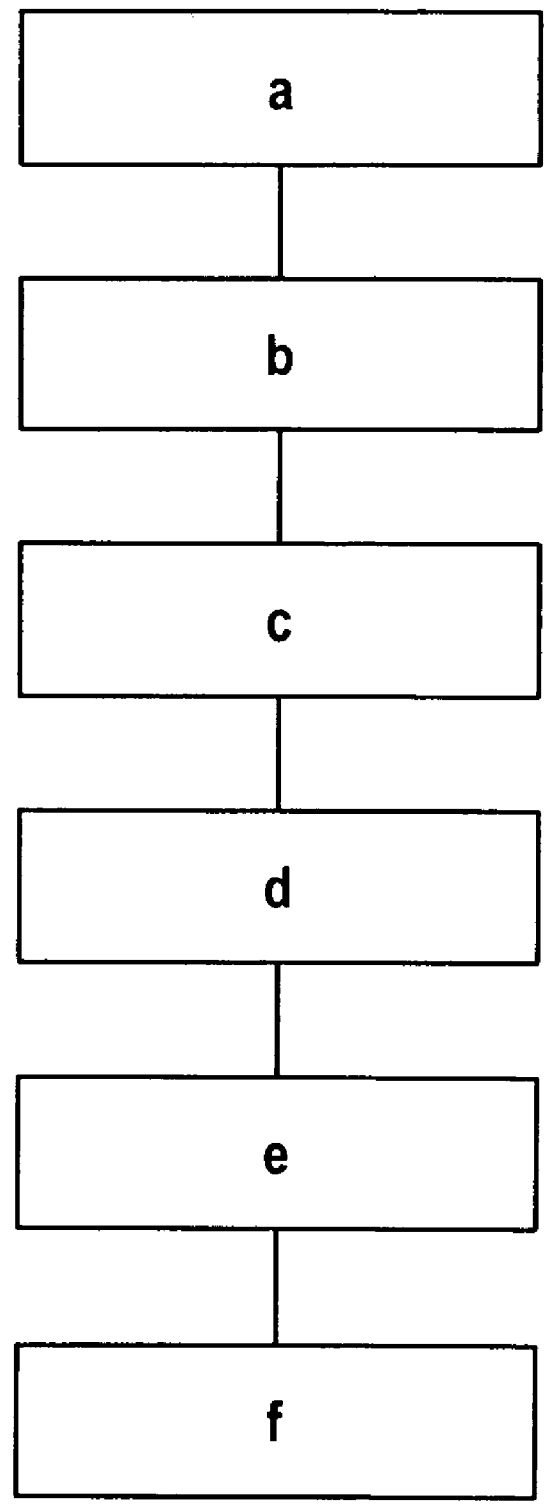
FIG. 4 shows a flow chart of the method according to the present invention.

FIG. 4 shows a flow chart of the method according to the present invention. The method for measuring current including a current sensor for measuring a current in a conductor, using at least two two-dimensional magnetic field sensors adjacent to the conductor, has the following method steps, reference being made to the fields shown in FIG. 1:

a. detecting a measuring field B using measured values of the magnetic field sensors;
b. determining the field strengths of a test field P in the direction of the field lines of a magnetic field N based on a current flowing in the conductor at the location of the sensors; for example, N2 is in the +x direction at second magnetic field sensor 14 in FIG. 1; N1 is in the −x direction at the first sensor, and accordingly P is in the x direction; only in the x direction is there an overlapping of interference field S and useful field N; $N1y=N1z=N2y=N2z=0$ is perpendicular to this;
c. determining the field strengths of a component S1y, S2y of an interference field S in a direction perpendicular to the field lines of magnetic field N based on the current flowing in the conductor at the location of the sensors;
d. detecting an inhomogeneity of an interference field from the determined field strengths of components S1y, S2y of the interference field; in this case, the inhomogeneity is determined using inhomogeneity ratio S1y/S2y.
e. determining useful field N based on the current flowing in the conductor from the field strengths of test field P and the inhomogeneity of interference field S using relationships $P1=N1+S1x$, $P2=N2+S2x$, $S1x/S2x=S1y/S2y$ and $N1=-N2$;
f. determining the current in the conductor from the useful field.

In an example embodiment of the method for measuring current, the magnetic field sensors are oriented in such a way that one measuring direction coincides with the direction of the field lines of a magnetic field based on a current flowing in the conductor. This example embodiment of the method was described in connection with the current sensor from FIG. 1.

In another example embodiment of the method for measuring current using a current sensor having two three-dimensional magnetic field sensors, the field strengths of the interference field are determined in one plane perpendicular to field lines of the magnetic field based on the current flowing in the conductor, and the inhomogeneity of the interference field is detected in the direction of the maximum field strength of the interference field within the plane. The highest accuracy is achieved in this manner.

What is claimed is:

1. A current sensor for measuring a current in a conductor, comprising:
   two magnetic field sensors located adjacent to the conductor, wherein the two magnetic field sensors are at least two-dimensional magnetic field sensors having two measuring directions; and
   an integrated evaluation unit configured to:
   (a) measure values of the magnetic field sensors to determine: (i) a test field in the direction of the field lines of the magnetic field based on the current flowing in the conductor, and (ii) an interference field in a direction perpendicular to field lines of the magnetic field based on the current flowing in the conductor;
   (b) detect an inhomogeneity of the interference field from the field strengths of the determined components of the interference field;
   (c) determine a useful field from the field strengths of the test field and the inhomogeneity of the interference field; and
   (d) determine the current in the conductor from the useful field.

2. The current sensor as recited in claim 1, wherein a first measuring direction of the magnetic field sensors is in the direction of field lines of a magnetic field based on a current flowing in the conductor, and wherein a second measuring direction is perpendicular to the first measuring direction.

3. The current sensor as recited in claim 2, wherein the two magnetic field sensors are three-dimensional magnetic field sensors.

4. The current sensor as recited in claim 3, wherein the two magnetic field sensors are symmetrically situated on two sides of the conductor.

5. The current sensor as recited in claim 3, further comprising:
(b) determining the current in the conductor from the test field and the interference field.

6. The current sensor as recited in claim 5, further comprising:
a housing surrounding the conductor, the two magnetic field sensors and the evaluation unit.

7. The current sensor as recited in claim 5, further comprising:
a carrier fastened to the conductor, wherein the magnetic field sensors are situated on the carrier.

8. The current sensor as recited in claim 2, wherein the two magnetic field sensors are symmetrically situated on two sides of the conductor.

9. The current sensor as recited in claim 8, wherein the two magnetic field sensors are selected from the group consisting of: Hall element sensor, anisotropic magnetoresistance sensors, giant magnetoresistance sensors, and fluxgate sensors.

10. A method for measuring current in a conductor, comprising:
providing a current sensor having at least two magnetic field sensors adjacent to the conductor, wherein the at least two magnetic field sensors are at least two-dimensional magnetic field sensors;
detecting a measuring field using measured values of the magnetic field sensors;
determining the field strengths of a test field in the direction of the field lines of a magnetic field based on a current flowing in the conductor;
determining the field strengths of a component of an interference field in a direction perpendicular to the field lines of the magnetic field based on the current flowing in the conductor;
detecting an inhomogeneity of the interference field from the field strengths of the determined components of the interference field;
determining a useful field from the field strengths of the test field and the inhomogeneity of the interference field
and determining the current in the conductor from the useful field.

11. The method as recited in claim 10, wherein the magnetic field sensors are oriented in such a way that one measuring direction coincides with the direction of the field lines of the magnetic field based on the current flowing in the conductor.

12. The method as recited in claim 11, wherein the at least two magnetic field sensors are three-dimensional magnetic field sensors, and wherein the field strengths of the interference field are determined in one plane perpendicular to the field lines of the magnetic field based on the current flowing in the conductor.

13. The method as recited in claim 12, wherein the inhomogeneity of the interference field is detected in the direction of the maximum field strength of the interference field within the one plane.

* * * * *